(12) United States Patent
Zeng et al.

(10) Patent No.: US 8,489,973 B1
(45) Date of Patent: Jul. 16, 2013

(54) NUMERICAL SOLUTION ON LLR EXCHANGE IN TURBO EQUALIZATION

(75) Inventors: Lingqi Zeng, Turlock, CA (US); Yu Kou, San Jose, CA (US)

(73) Assignee: SK hynix memory solutions inc., San Jose, CA (US)

( * ) Notice: Subject to any disclaimer, the term of this patent is extended or adjusted under 35 U.S.C. 154(b) by 123 days.

(21) Appl. No.: 13/196,729

(22) Filed: Aug. 2, 2011

Related U.S. Application Data (60) Provisional application No. 61/400,826, filed on Aug. 2, 2010.

(51) Int. Cl.
*H03M 13/03* (2006.01)

(52) U.S. Cl.
USPC ............................ 714/795; 714/786; 714/752

(58) Field of Classification Search
USPC .................. 714/795, 755, 786, 752, 774, 748
See application file for complete search history.

(56) References Cited

U.S. PATENT DOCUMENTS

| | | | | |
|---|---|---|---|---|
| 7,027,533 | B2 * | 4/2006 | Abe et al. ........................ | 375/341 |
| 8,291,304 | B2 * | 10/2012 | Yoshida et al. ................ | 714/795 |
| 2001/0010089 | A1 * | 7/2001 | Gueguen ........................ | 714/786 |
| 2007/0296500 | A1 * | 12/2007 | Yang .............................. | 330/278 |
| 2008/0276156 | A1 | 11/2008 | Gunnam et al. | |
| 2008/0301521 | A1 | 12/2008 | Gunnam et al. | |
| 2011/0032973 | A1 * | 2/2011 | To et al. ........................ | 375/141 |
| 2012/0216093 | A1 * | 8/2012 | Djordjevic et al. ............ | 714/755 |
| 2013/0023222 | A1 * | 1/2013 | Yablonka et al. ............. | 455/130 |

* cited by examiner

*Primary Examiner* — Fritz Alphonse
(74) *Attorney, Agent, or Firm* — Van Pelt, Yi & James LLP (57) ABSTRACT

The present application refers to a method for determining an extrinsic information input to an ECC decoder of a turbo equalizer. In one embodiment, a first loop-back signal is represented with a first number of bits, wherein the first loop-back signal comprises a signal looped back from an output of an ECC decoder. An output of a signal detector is represented with a second number of bits. An extrinsic information input to the ECC decoder is determined based at least in part on the first loop-back signal, the represented output of the signal detector, and at least one comparison with at least one predetermined threshold.

44 Claims, 5 Drawing Sheets

NUMERICAL SOLUTION ON LLR EXCHANGE IN TURBO EQUALIZATION

CROSS REFERENCE TO OTHER APPLICATIONS

This application claims priority to U.S. Provisional Patent Application No. 61/400,826 entitled NUMERICAL SOLUTION ON LLR EXCHANGE IN TURBO EQUALIZATION filed Aug. 2, 2010 which is incorporated herein by reference for all purposes.

BACKGROUND OF THE INVENTION

Low-density parity-check (LDPC) codes are a type of error correcting code. LDPC codes are becoming increasingly popular for encoding data that is written to storage media, such as hard disk drives or flash drives. It would be desirable to develop techniques for LDPC storage applications.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

In various embodiments, the techniques described herein are implemented in a variety of systems or forms. In some embodiments, the techniques are implemented in hardware as an application-specific integrated circuit (ASIC) or a field-programmable gate array (FPGA). In some embodiments, a processor (e.g., an embedded one such as an ARM core) is used where the processor is provided or loaded with instructions to perform the techniques described herein. In some embodiments, the technique is implemented as a computer program product which is embodied in a computer readable storage medium and comprises computer instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
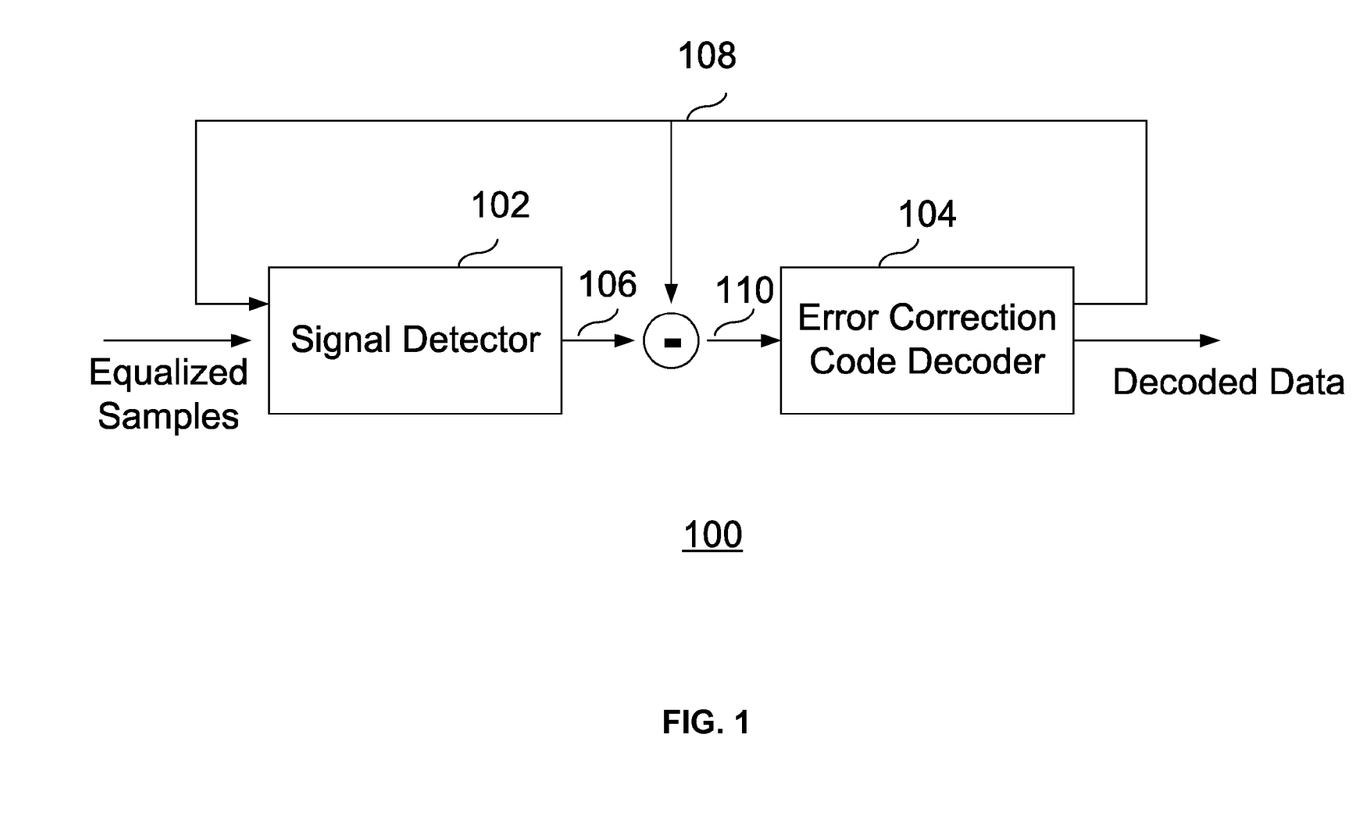
FIG. 1 is a block diagram illustrating an embodiment of a receiver system 100.

FIG. 1 is a block diagram illustrating an embodiment of a receiver system 100. In some embodiments, receiver system 100 is used to read data from storage media (e.g., Flash storage or magnetic disk storage). In some other embodiments, the techniques described herein are used in a communication system and are implemented in a wired or wireless receiver.

As shown in FIG. 1, receiver 100 is configured as a turbo equalizer. Equalized samples are fed as input into a signal detector 102. In a turbo equalizer, a feedback loop is formed between signal detector 102 and an error correction code (ECC) decoder 104, which outputs the decoded data. For example, the output of ECC decoder 104 (ECC decoder output 108) is looped back as an input to signal detector 102. In addition, ECC decoder output 108 is looped back and subtracted from the output of signal detector 102 (signal detector output 106) to provide an extrinsic information input 110 into ECC decoder 104. The turbo equalizer repeats this iterative process until a stopping criterion is reached.

In some embodiments, signal detector 102 is a soft-input soft-output (SISO) equalizer providing soft information to ECC decoder 104. For example, signal detector 102 may be implemented using a soft output Viterbi algorithm (SOVA). In other examples, signal detector 102 is implemented using a Max-Log-MAP algorithm or MAP algorithm.

In some embodiments, the soft information output from signal detector 102 is a probability of a sample being a particular symbol. For example, if the samples are bit-based, then the symbols are either zero or one, i.e., the symbols form a Galois field of 2, GF(2), and thus, $$Pr(sample==1)+Pr(sample==0)=1$$

The soft information may be represented in a log-likelihood ratio (LLR), which is defined by the following equation:

$$LLR(c_i) = \log\left(\frac{Pr(c_i = 0 \mid \text{channel output for } c)}{Pr(c_i = 1 \mid \text{channel output for } c)}\right)$$

where $c_i$ is the $i^{th}$ bit of the transmitted codeword, c.

In some embodiments, ECC decoder 104 is an SISO decoder, such as an LDPC decoder. In various embodiments, LDPC decoder 104 may be implemented using various algorithms, including the sum-product algorithm, min-sum algorithm, and belief propagation algorithm.

Figure 2:
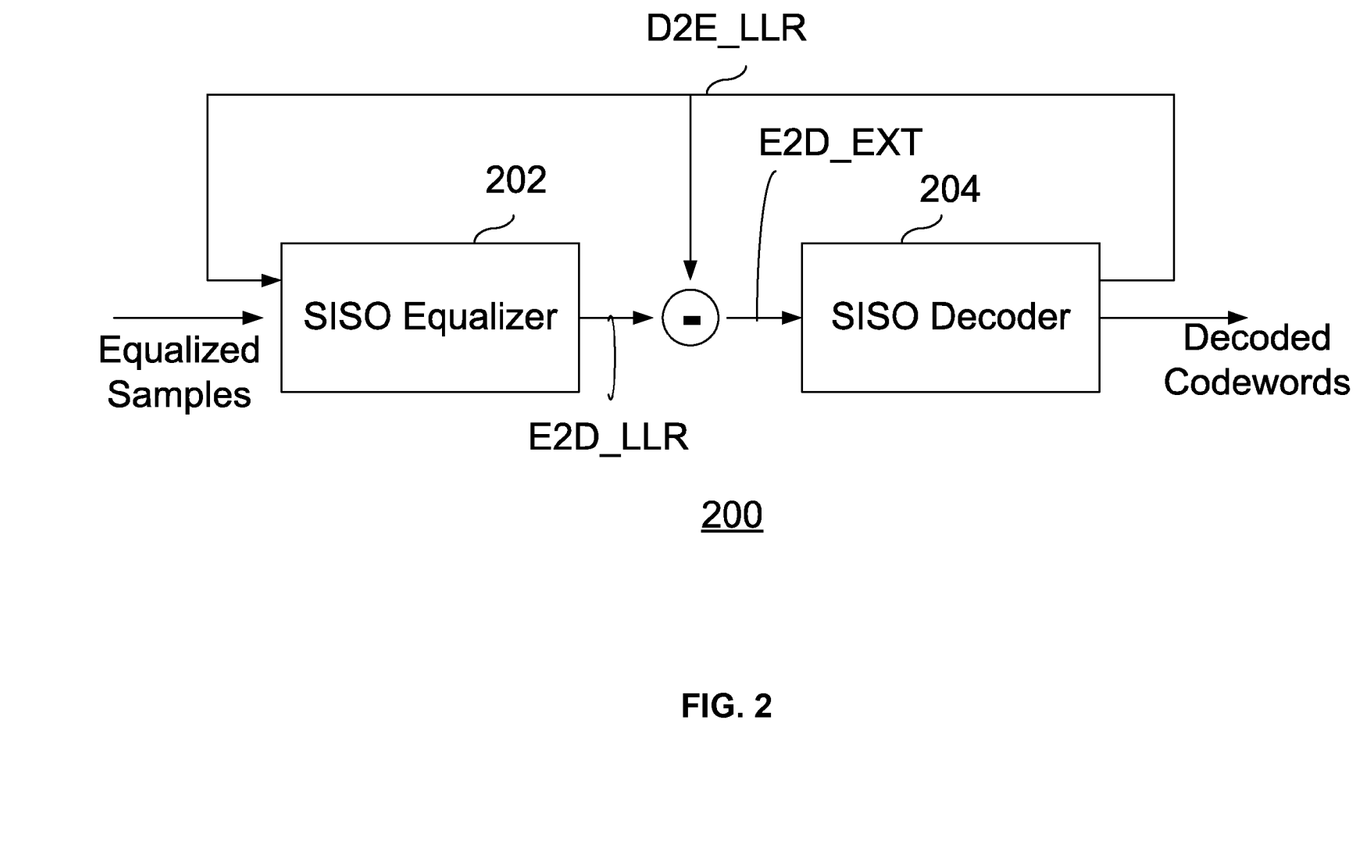
FIG. 2 is a block diagram illustrating an embodiment of a receiver system 200 configured as a turbo equalizer with an SISO equalizer 202 and an SISO decoder 204.

FIG. 2 is a block diagram illustrating an embodiment of a receiver system 200 configured as a turbo equalizer with an SISO equalizer 202 and an SISO decoder 204. SISO equalizer 202 processes the equalized samples and the signal D2E_LLR together and then outputs the signal E2D_LLR. D2E_LLR is a loop-back output signal from SISO decoder 204 and has a zero value during the first pass. The extrinsic information input to SISO decoder 204 is E2D_EXT, which is obtained by subtracting D2E_LLR from E2D_LLR. SISO decoder 204 decodes the input E2D_EXT. If the decoding is successful or a predefined maximum iteration number is reached, then SISO decoder 204 outputs the decoded codewords. If the decoding is not successful, then SISO decoder 204 outputs D2E_LLR as a loop-back signal and the above iterative process is repeated.

In a turbo equalizer, SISO equalizer 202 and SISO decoder 204 exchange soft information with each other. In addition, the turbo equalizer takes into consideration the parity check constraints on the transmitted symbols that are imposed by SISO decoder 204. As a result, the overall system performance is improved.

The output of SISO equalizer 202, E2D_LLR, can be estimated by $$E2D\_LLR = D2E\_LLR + E2D\_EXT \quad \text{equation (1)}$$

In order to reduce correlation and performance degradation, the input to SISO decoder 204, E2D_EXT, is obtained by subtracting D2E_LLR from E2D_LLR.

Since computing and maintaining values with a greater number of bits (e.g., using floating-point numbers) translates to more hardware, in order to reduce the amount of hardware for implementing receiver system 100 or receiver system 200, the various values within receiver system 100 or receiver 200 may be maintained by signal detector 102 and ECC decoder 104 using a fewer number of bits.

In some embodiments, soft information values within receiver system 200 including D2E_LLR, E2D_LLR, and E2D_EXT are represented by $N_1$, $N_2$, and $N_3$ number of bits, respectively. In some embodiments, $N_1$, $N_2$, and $N_3$ are different from each other.

In some embodiments, $N_1$, $N_2$, and $N_3$ are the same and are equal to N number of bits. The maximum and minimum values that can be represented with N number of bits are $(2^{(N-1)}-1)$ and $(-2^{(N-1)})$, respectively. If a positive soft information value exceeds the maximum value, the positive soft information can be saturated to the maximum value of $(2^{(N-1)}-1)$. If a negative soft information value is smaller than the minimum value, the negative soft information can be saturated to the minimum value of $(-2^{(N-1)})$. In some embodiments, the magnitude of the soft information value is saturated to $(2^{(N-1)}-1)$. Referring back to equation (1) above, SISO equalizer 202 will output the following:

$$E2D\_LLR = \text{Saturation}(D2E\_LLR + E2D\_EXT) \quad \text{equation (2)}$$

However, equation (2) may cause a mismatch in some cases. In one example, E2D_LLR is equal to 14 and D2E_LLR is equal to 7 when they are represented as floating-point numbers. Using floating-point arithmetic, E2D_EXT=E2D_LLR−D2E_LLR=14−7=7. However, using N=4 bits to represent these soft information values, E2D_LLR will be saturated to 7. After subtraction, E2D_EXT=E2D_LLR−D2E_LLR=7−7=0. As shown in this illustrative example, a mismatch is created because a large soft information value, 7, indicating a high confidence level, is represented by a zero soft information value, which indicates the lowest possible confidence level.

Figure 3:
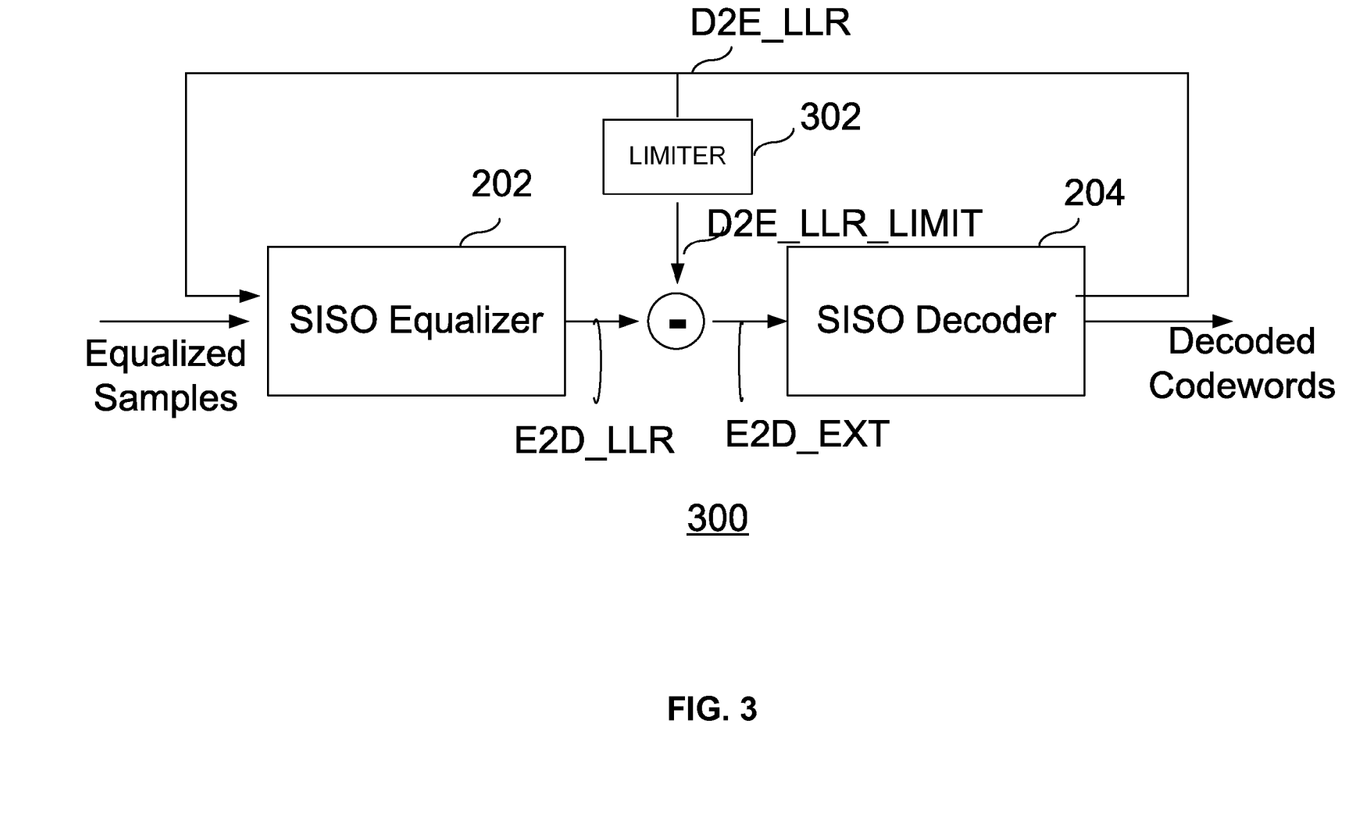
FIG. 3 is a block diagram illustrating an embodiment of a receiver system 300 configured as a turbo equalizer with an SISO equalizer 202, an SISO decoder 204, and a limiter 302.

FIG. 3 is a block diagram illustrating an embodiment of a receiver system 300 configured as a turbo equalizer with an SISO equalizer 202, an SISO decoder 204, and a limiter 302. Limiter 302 limits the magnitude of the loop-back signal D2E_LLR to a predefined threshold. The output of limiter 302 is referred to as D2E_LLR_LIMIT, and the extrinsic information input to SISO decoder 204, E2D_EXT, is obtained by subtracting D2E_LLR_LIMIT from E2D_LLR.

In some embodiments, the predefined threshold associated with limiter 302 is a fraction of the saturated values of D2E_LLR. In some embodiments, the predefined threshold associated with limiter 302 can be set to zero. As an illustrative example, with N=4 bits, the saturated values of D2E_LLR are 7 and −8 (or 7 and −7). Using a fraction equal to ⅓, the predefined threshold is 2.

Assuming that E2D_LLR=14 and D2E_LLR=7 in floating-point representation, E2D_LLR is saturated to 7 when it is represented as a 4-bit number, and D2E_LLR is limited to 2 by limiter 302. After subtraction, E2D_EXT=E2D_LLR−D2E_LLR_LIMIT=7−2=5. As illustrated by this example, limiter 302 reduces the degree of mismatch, because the 4-bit number representation of E2D_EXT (i.e., a value of 5) is a closer match to its actual value (i.e., a value of 7).

Figure 4:
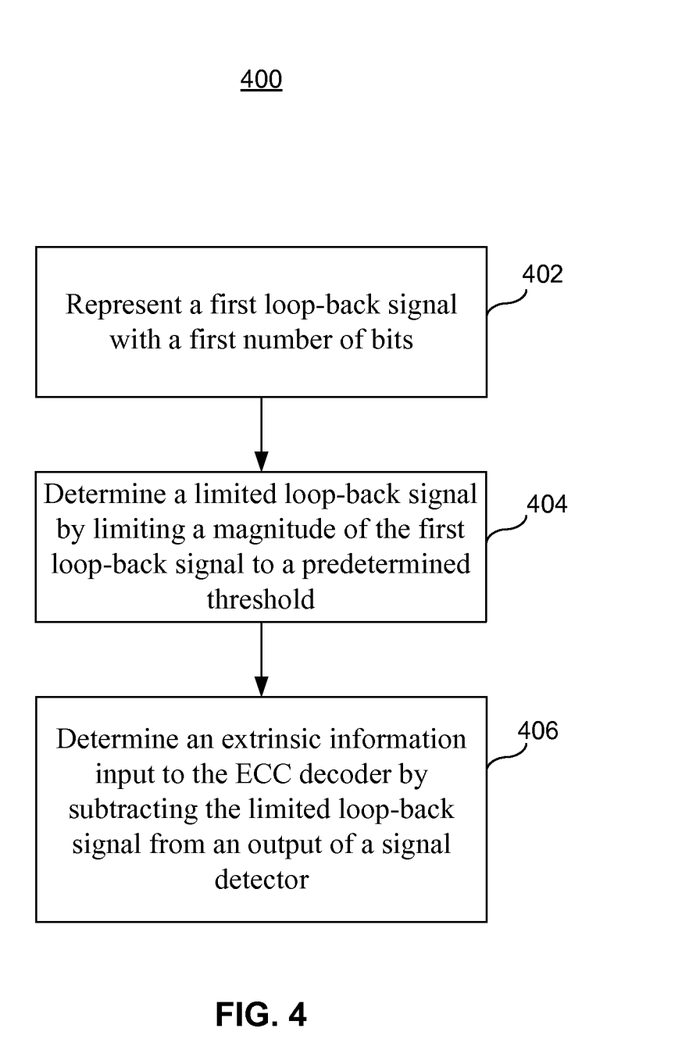
FIG. 4 is a flow chart illustrating an embodiment of a process 400 for determining an extrinsic information input to an ECC decoder of a turbo equalizer.

FIG. 4 is a flow chart illustrating an embodiment of a process 400 for determining an extrinsic information input to an ECC decoder of a turbo equalizer. The turbo equalizer includes a signal detector, an ECC decoder, and a limiter. In some embodiments, process 400 is performed by receiver system 300 shown in FIG. 3.

At 402, a first loop-back signal is represented with a first number of bits. The first loop-back signal is a signal looped back from the output of the ECC decoder. In some embodiments, the ECC decoder is a SISO decoder, such as an LDPC decoder. In some embodiments, the first number of bits is a single-digit number, such as a number within a range of four to six.

At 404, a limited loop-back signal is determined by limiting the magnitude of the first loop-back signal to a predetermined threshold. In some embodiments, step 404 is implemented by a limiter. In some embodiments, the limiter takes the first loop-back signal as input and outputs the limited loop-back signal. If the magnitude of the first loop-back signal is smaller or equal to the predetermined threshold, then the limiter sets the limited loop-back signal to the first loop-back signal. Otherwise, the limiter sets the magnitude of the limited loop-back signal to the predetermined threshold. For example, if the first loop-back signal has a value of 1 and the predetermined threshold is 2, then the limited loop-back signal is set to 1. In another example, if the first loop-back signal has a value of 7 and the predetermined threshold is 2, then the limited loop-back signal is set to 2. In some embodiments, the first loop-back signal is a negative number. For example, if the first loop-back signal has a value of −7 and the predetermined threshold is 2, then the limited loop-back signal is set to −2.

In some embodiments, the predetermined threshold is a fraction of a saturated value for the first loop-back signal represented with the first number of bits. For example, the fraction may be a small fraction or fraction less than ½, such as ⅓, ¼, or zero. However, other fractions may be used as well. In some embodiments, the saturated value for the first loop-back signal is a maximum magnitude that can be represented with the first number of bits. For example, if the first number of bits is N, then the saturated value is $(2^{(N-1)}-1)$ or $2^{(N-1)}$.

At 406, an extrinsic information input to the ECC decoder is determined by subtracting the limited loop-back signal from the output of a signal detector in the turbo equalizer. In some embodiments, the signal detector is an SISO equalizer providing soft information to the ECC decoder. In some embodiments, the signal detector takes a signal looped back from the output of the ECC decoder and equalized samples as input, and outputs an LLR value. Because the signal detector takes a signal looped back from the output of the ECC decoder as an input, the output of the signal detector includes soft information that is already known to the ECC decoder. In order to reduce correlation and performance degradation of the turbo equalizer, only the extrinsic soft information is fed into the ECC decoder as an input. In particular, the extrinsic information input is obtained by subtracting the limited loop-back signal from the output of the signal detector. In some embodiments, the extrinsic information input is an LLR value.

Figure 5:
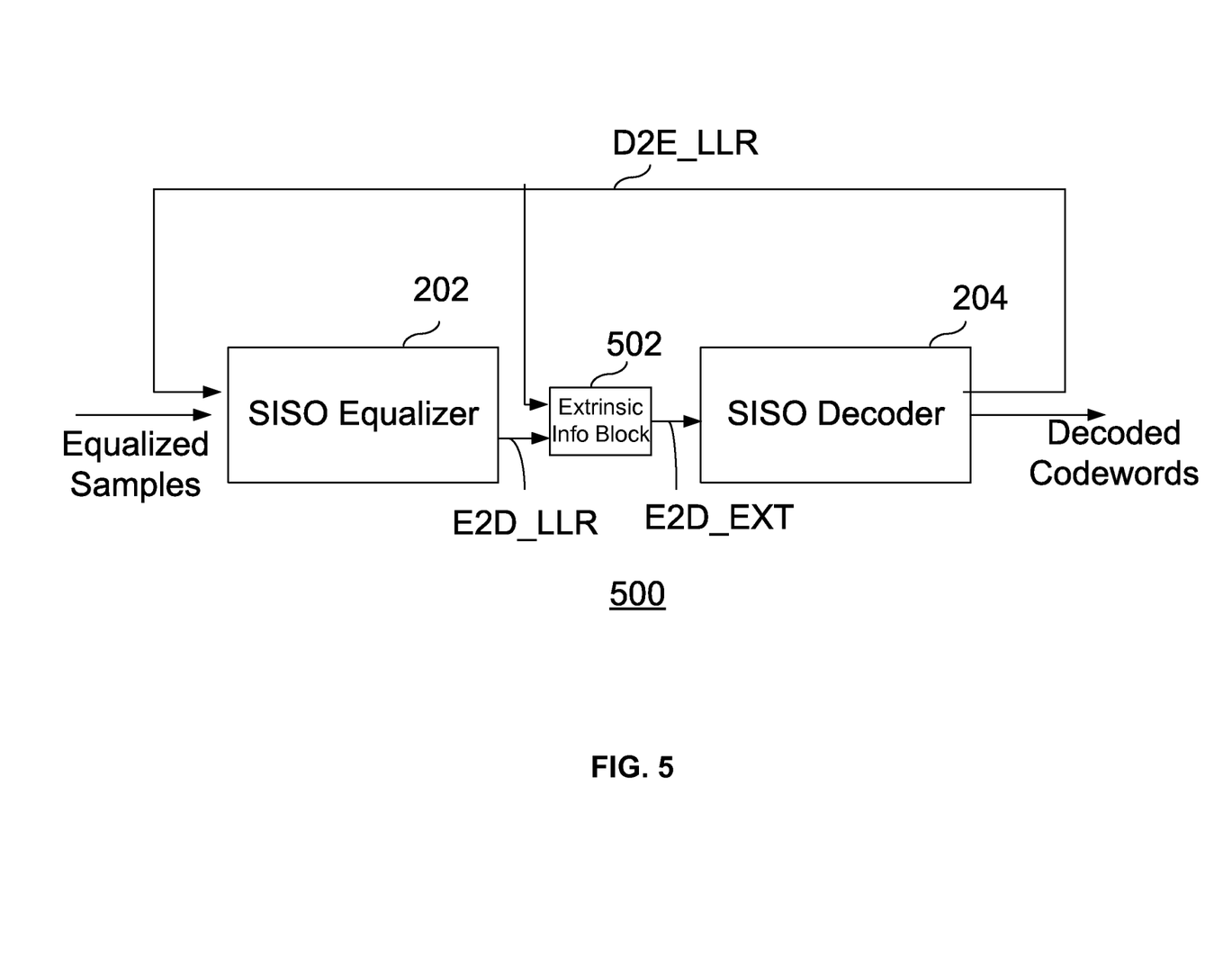
FIG. 5 is a block diagram illustrating an embodiment of a receiver system 500 configured as a turbo equalizer with an SISO equalizer 202, an SISO decoder 204, and an extrinsic information block 502.

FIG. 5 is a block diagram illustrating an embodiment of a receiver system 500 configured as a turbo equalizer with an SISO equalizer 202, an SISO decoder 204, and an extrinsic information block 502. Extrinsic information block 502 determines the extrinsic information input (E2D_EXT) that is input into SISO decoder 204. Extrinsic information block 502 determines E2D_EXT at least in part based on the values of D2E_LLR and E2D_LLR.

In some embodiments, extrinsic information block 502 determines the extrinsic information input (E2D_EXT) as follows:

equation (3)

As shown in equation (3) above, if E2D_LLR is saturated and the magnitude of D2E_LLR is greater than a certain threshold, then E2D_EXT is set to a predetermined value. Otherwise, E2D_EXT is obtained by subtracting D2E_LLR from E2D_LLR as previously described.

In some embodiments, D2E_LLR, E2D_LLR, and E2D_EXT are represented by $N_1$, $N_2$, and $N_3$ number of bits, respectively. In some embodiments, $N_1$, $N_2$, and $N_3$ are different from each other. In some embodiments, $N_1$, $N_2$, and $N_3$ are the same and are equal to N number of bits.

In some embodiments, B1 and B2 in equation (3) are the same. In some embodiments, B1 and B2 are different from each other. In some embodiments, A1 and A2 in equation (3) are the same. In some embodiments, A1 and A2 are different from each other.

In some embodiments, B1 or B2 is a fraction of a saturated value of D2E_LLR. For example, if D2E_LLR is represented as a $N_1$-bit number, then the saturated value is a maximum magnitude that can be represented with $N_1$ number of bits. For example, the saturated value is $(2^{(N_1-1)}-1)$ or $2^{(N_1-1)}$. In some embodiments, the fraction for calculating B1 or B2 is a small fraction, such as ⅓, ¼, or zero. However, other fractions may be used as well.

In some embodiments, A1 or A2 is a fraction of a saturated value of E2D_EXT. For example, if E2D_EXT is represented as a $N_3$-bit number, then the saturated value is a maximum magnitude that can be represented with $N_3$ number of bits. For example, the saturated value is $(2^{(N_3-1)}-1)$ or $2^{(N_3-1)}$. In some embodiments, the fraction for calculating A1 or A2 is a large fraction or fraction greater than ½, such as ¾, ⅚, or 1. However, other fractions may be used as well.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for determining an extrinsic information input to an error correction code (ECC) decoder of a turbo equalizer, comprising:
   representing a first loop-back signal with a first number of bits, wherein the first loop-back signal comprises a signal looped back from an output of an ECC decoder;
   determining by a limiter a limited loop-back signal by limiting a magnitude of the first loop-back signal to a predetermined threshold; and
   determining an extrinsic information input to the ECC decoder based at least in part on the limited loop-back signal and an output of a signal detector.

2. The method of claim 1, wherein determining the extrinsic information input comprises subtracting the limited loop-back signal from the output of the signal detector.

3. The method of claim 1, wherein the predetermined threshold is a fraction of a saturated value for the first loop-back signal represented with the first number of bits.

4. The method of claim 3, wherein the saturated value is a maximum magnitude that can be represented with the first number of bits.

5. The method of claim 1, wherein a second loop-back signal is fed as an input into the signal detector, and wherein the second loop-back signal comprises a signal looped back from the output of the ECC decoder.

6. The method of claim 1, wherein equalized samples are fed as input into the signal detector.

7. The method of claim 1, wherein the signal detector comprises a soft-input soft-output (SISO) equalizer.

8. The method of claim 1, wherein the ECC decoder comprises an LDPC decoder.

9. The method of claim 1, wherein the extrinsic information input comprises a log-likelihood ratio (LLR).

10. A system for determining an extrinsic information input to an error correction code (ECC) decoder of a turbo equalizer, comprising:
    a signal detector; and
    an ECC decoder; and
    wherein the system is configured to:
      represent a first loop-back signal with a first number of bits, wherein the first loop-back signal comprises a signal looped back from an output of the ECC decoder;
      determine a limited loop-back signal by limiting a magnitude of the first loop-back signal to a predetermined threshold; and
      determine an extrinsic information input to the ECC decoder based at least in part on the limited loop-back signal and an output of a signal detector.

11. The system of claim 10, wherein determining the extrinsic information input comprises subtracting the limited loop-back signal from the output of the signal detector.

12. The system of claim 10, wherein the predetermined threshold is a fraction of a saturated value for the first loop-back signal represented with the first number of bits.

13. The system of claim 12, wherein the saturated value is a maximum magnitude that can be represented with the first number of bits.

14. The system of claim 10, wherein a second loop-back signal is fed as an input into the signal detector, and wherein the second loop-back signal comprises a signal looped back from the output of the ECC decoder.

15. The system of claim 10, wherein equalized samples are fed as input into the signal detector.

16. The system of claim 10, wherein the signal detector comprises a soft-input soft-output (SISO) equalizer.

17. The system of claim 10, wherein the ECC decoder comprises an LDPC decoder.

18. The system of claim 10, wherein the extrinsic information input comprises a log-likelihood ratio (LLR).

19. A method for determining an extrinsic information input to an error correction code (ECC) decoder of a turbo equalizer, comprising:
    representing a first loop-back signal with a first number of bits, wherein the first loop-back signal comprises a signal looped back from an output of an ECC decoder;
    representing an output of a signal detector with a second number of bits; and
    determining using an extrinsic information block an extrinsic information input to the ECC decoder based at least in part on the first loop-back signal, the represented output of the signal detector, and at least one comparison with at least one predetermined threshold.

20. The method of claim 19, wherein determining comprises:
    in the event that a first condition is met, determining the extrinsic information input as a first positive predetermined threshold, wherein the first condition is met if the first loop-back signal exceeds a second positive predetermined threshold and further if the represented output of the signal detector is positively saturated;
    in the event that a second condition is met, determining the extrinsic information input as a first negative predetermined threshold, wherein the second condition is met if the first loop-back signal is less than a second negative predetermined threshold and further if the represented output of the signal detector is negatively saturated; and
    in the event that the first condition and the second condition are not met, determining the extrinsic information input, wherein determining comprises subtracting the first loop-back signal from the output of the signal detector.

21. The method of claim 20, wherein a magnitude of the first positive predetermined threshold is the same as a magnitude of the first negative predetermined threshold.

22. The method of claim 20, wherein a magnitude of the second positive predetermined threshold is the same as a magnitude of the second negative predetermined threshold.

23. The method of claim 20, wherein a magnitude of the first positive predetermined threshold is a fraction of a saturated value for the extrinsic information input represented with a third number of bits.

24. The method of claim 23, wherein the saturated value is a maximum magnitude that can be represented with the third number of bits.

25. The method of claim 20, wherein a magnitude of the second positive predetermined threshold is a fraction of a saturated value for the first loop-back signal represented with the first number of bits.

26. The method of claim 25, wherein the saturated value is a maximum magnitude that can be represented with the first number of bits.

27. The method of claim 19, wherein a second loop-back signal is fed as an input into the signal detector, and wherein the second loop-back signal comprises a signal looped backed from the output of the ECC decoder.

28. The method of claim 19, wherein equalized samples are fed as input into the signal detector.

29. The method of claim 19, wherein the signal detector comprises a soft-input soft-output (SISO) equalizer.

30. The method of claim 19, wherein the ECC decoder comprises an LDPC decoder.

31. The method of claim 19, wherein the extrinsic information input comprises a log-likelihood ratio (LLR).

32. A system for determining an extrinsic information input to an error correction code (ECC) decoder of a turbo equalizer, comprising:
    a signal detector; and
    an ECC decoder; and
    wherein the system is configured to:
        represent a first loop-back signal with a first number of bits, wherein the first loop-back signal comprises a signal looped back from an output of the ECC decoder;
        represent an output of the signal detector with a second number of bits; and
        determine an extrinsic information input to the ECC decoder based at least in part on the first loop-back signal, the represented output of the signal detector, and at least one comparison with at least one predetermined threshold.

33. The system of claim 32, wherein determining comprises:
    in the event that a first condition is met, determining the extrinsic information input as a first positive predetermined threshold, wherein the first condition is met if the first loop-back signal exceeds a second positive predetermined threshold and further if the represented output of the signal detector is positively saturated;
    in the event that a second condition is met, determining the extrinsic information input as a first negative predetermined threshold, wherein the second condition is met if the first loop-back signal is less than a second negative predetermined threshold and further if the represented output of the signal detector is negatively saturated; and
    in the event that the first condition and the second condition are not met, determining the extrinsic information input, wherein determining comprises subtracting the first loop-back signal from the output of the signal detector.

34. The system of claim 33, wherein a magnitude of the first positive predetermined threshold is the same as a magnitude of the first negative predetermined threshold.

35. The system of claim 33, wherein a magnitude of the second positive predetermined threshold is the same as a magnitude of the second negative predetermined threshold.

36. The system of claim 33, wherein a magnitude of the first positive predetermined threshold is a fraction of a saturated value for the extrinsic information input represented with a third number of bits.

37. The system of claim 36, wherein the saturated value is a maximum magnitude that can be represented with the third number of bits.

38. The system of claim 33, wherein a magnitude of the second positive predetermined threshold is a fraction of a saturated value for the first loop-back signal represented with the first number of bits.

39. The system of claim 38, wherein the saturated value is a maximum magnitude that can be represented with the first number of bits.

40. The system of claim 32, wherein a second loop-back signal is fed as an input into the signal detector, and wherein the second loop-back signal comprises a signal looped backed from the output of the ECC decoder.

41. The system of claim 32, wherein equalized samples are fed as input into the signal detector.

42. The system of claim 32, wherein the signal detector comprises a soft-input soft-output (SISO) equalizer.

43. The system of claim 32, wherein the ECC decoder comprises an LDPC decoder.

44. The system of claim 32, wherein the extrinsic information input comprises a log-likelihood ratio (LLR).

* * * * *